United States Patent
Ashtiani et al.

(10) Patent No.: US 6,905,959 B1
(45) Date of Patent: Jun. 14, 2005

(54) APPARATUS AND METHOD FOR DEPOSITING SUPERIOR TA (N) COPPER THIN FILMS FOR BARRIER AND SEED APPLICATIONS IN SEMICONDUCTOR PROCESSING

(75) Inventors: Kaihan A. Ashtiani, Sunnyvale, CA (US); Maximilian A. Biberger, Palo Alto, CA (US); Erich R. Klawuhn, San Jose, CA (US); Kwok Fai Lai, Palo Alto, CA (US); Karl B. Levy, Los Altos, CA (US); J. Patrick Rymer, Livermore, CA (US)

(73) Assignee: Novellus Systems, Inc., San Jose, CA (US)

( * ) Notice: Subject to any disclaimer, the term of this patent is extended or adjusted under 35 U.S.C. 154(b) by 30 days.

(21) Appl. No.: 10/335,464

(22) Filed: Dec. 31, 2002

Related U.S. Application Data

(63) Continuation of application No. 09/491,853, filed on Jan. 26, 2000, now Pat. No. 6,541,371.
(60) Provisional application No. 60/119,314, filed on Feb. 8, 1999.

(51) Int. Cl.⁷ .......................................... H01L 21/4763
(52) U.S. Cl. ...................... 438/648; 438/643; 438/627; 438/653; 438/656; 438/685
(58) Field of Search ................................. 438/627, 643, 438/648, 653, 656, 685, 629, 687, FOR 350; 204/192.17

(56) References Cited

U.S. PATENT DOCUMENTS

| | | |
|---|---|---|
| 4,985,750 A | 1/1991 | Hoshino |
| 5,117,276 A | 5/1992 | Thomas et al. |
| 5,283,453 A | 2/1994 | Rajeevakumar |
| 5,374,592 A | 12/1994 | McNaughton et al. |
| 5,603,988 A | 2/1997 | Shapiro et al. |
| 5,668,054 A | 9/1997 | Sun et al. |
| 5,714,418 A | 2/1998 | Bai et al. |
| 5,900,672 A | 5/1999 | Chan et al. |
| 5,919,531 A | 7/1999 | Arkles et al. |
| 5,939,788 A | 8/1999 | McTeer |
| 6,037,258 A * | 3/2000 | Liu et al. ..................... 438/687 |
| 6,071,809 A * | 6/2000 | Zhao .......................... 438/634 |
| 6,080,285 A | 6/2000 | Liu et al. |
| 6,146,986 A * | 11/2000 | Wagganer ................... 438/618 |
| 6,221,758 B1 | 4/2001 | Liu et al. |
| 6,255,192 B1 * | 7/2001 | Dornisch .................... 438/430 |
| 6,294,466 B1 | 9/2001 | Chang |

FOREIGN PATENT DOCUMENTS

JP      2000183160 A     6/2000

\* cited by examiner

*Primary Examiner*—George Fourson
*Assistant Examiner*—Julio J. Maldonado
(74) *Attorney, Agent, or Firm*—DeLio & Peterson, LLC

(57) ABSTRACT

A method of depositing thin films comprising tantalum, tantalum nitride, and copper for barrier films and seed layers within high aspect ratio openings used for copper interconnects. The barrier films and seed layers are deposited at extremely low temperature conditions wherein the wafer stage temperature of the sputter source is chilled to about −70° C. to about 0° C. Most preferably, the present invention is practiced using a hollow cathode magnetron. The resulting tantalum and/or tantalum nitride barrier films and copper seed layers are superior in surface smoothness, grain size and uniformity such that subsequent filling of the high aspect ratio opening is substantially void-free.

5 Claims, 5 Drawing Sheets

APPARATUS AND METHOD FOR DEPOSITING SUPERIOR TA (N) COPPER THIN FILMS FOR BARRIER AND SEED APPLICATIONS IN SEMICONDUCTOR PROCESSING

This application is a continuation of Ser. No. 09/491,853, filed Jan. 26, 2000, now U.S Pat. No. 6,541,371, which claims the benefit of U.S. Provisional Application No. 60/119,314 filed on Feb. 8, 1999.

BACKGROUND OF THE INVENTION

1. Field of the Invention

The present invention relates to an apparatus and method for depositing tantalum (Ta) and tantalum nitride (TaN) barrier films, and copper (copper) thin films for applications in semiconductor processing. The preferred embodiment of this invention is related to U.S. Pat. No. 5,482,611 entitled "Physical Vapor Deposition Employing Ion Extraction From a Plasma" issued on Jan. 9, 1996 to Helmer et al., and assigned to the same assignee, Novellus Systems, Inc., and incorporated herein by reference in its entirety.

2. Description of Related Art

Tantalum and/or tantalum nitride for barrier liners and copper seed layers are being considered by all major manufacturers as the primary interconnect metals for applications in semiconductor processing in the next generation of integrated circuits (ICs). This is primarily due to lower manufacturing costs and increased performance of the ICs when copper is used as the primary interconnect metal as opposed to aluminum.

In a typical application, a dielectric is deposited, e.g., using plasma enhanced chemical vapor deposition (PECVD), and then patterned, e.g., by plasma etching, to open contacts to either a previous layer or making contact to the semiconductor device. A thin layer of tantalum and/or tantalum nitride is deposited using a physical vapor deposition (PVD) technique as a barrier to the copper interconnect. This barrier layer prevents diffusion of copper into the semiconductor devices as copper diffusion is detrimental to the performance of the devices resulting in shorts. Thereafter, a thin layer of copper is deposited as the seed layer for subsequent electroplating or CVD fill of the structure, again using a PVD technique. The copper seed layer, as apparent from its name, provides a favorable thin film upon which nucleation and growth of copper, as the fill material, may be promoted.

It is important for the tantalum/tantalum nitride barrier layer to be continuous providing a "no hole" blanket inside the patterned feature such that copper does not diffuse pass the barrier into the electronic devices. It is equally important for the copper seed layer to be continuous to provide a "no hole" film for nucleation and growth of subsequent copper fill on all surfaces of the feature to be filled with copper. For electroplating fill applications, the copper seed layer continuity is even moor significant because the necessary electroplating current needs to flow throughout the thin copper seed layer. In addition, due to the presence of acidic species in the electroplating bath, a non-continuous or too thin copper film may be dissolved by the bath before any nucleation and growth of the electroplating film may occur.

Other important properties of the barrier and seed layers that need to be controlled are surface smoothness and grain size. For the case of tantalum/tantalum nitride, it is important that the films be amorphous and/or nano-crystalline such that grain boundary diffusion is reduced for reduced diffusion paths of copper through the tantalum/tantalum nitride barrier layers and into the devices. Thus, it would be desirable to develop a method of depositing a smooth and/or nano-crystalline tantalum/tantalum nitride having reduced grain boundary diffusion.

As the critical dimension of semiconductor devices gets smaller, the patterned contact or via holes get narrower and deeper, i.e. the aspect ratio of the contact or vias increase. Standard PVD techniques are proven to be inadequate for depositing films in narrow, high aspect ratio structures with necessary and sufficient step coverage. A technique that improves directionality of the depositing species and therefore improves the step coverage is ionized PVD (IPVD). Several techniques have been employed to achieve IPVD such as Radio Frequency biased IPVD (RFIPVD), Ion Metal Plasma (IMP), and Hollow Cathode Magnetron (HCM) can be named. However, many of he IPVD sources suffer from the fact that they cannot produce a sufficiently high density plasma that can adequately ionize the depositing metal species. The RFIVD and IMP IPVD sources produce medium plasma densities in the order $1-5 \times 10^{11}$ particles/$cm^3$. This requires the use of RF bias on the wafer pedestal in order to accelerate the ions in the plasma sheath near the wafer to obtain better step coverage. However, the use of RF bias on the wafer causes an increase in the wafer temperature. An increase in temperature would degrade the quality of films such as t tantalum/tantalum nitride and copper resulting in decreased barrier performance and unsatisfactory copper fill as mentioned above. This tends to limit the application of medium density plasma IPVD sources (RFIPVD and IMP) for certain applications including that of tantalum/tantalum nitride barrier and copper seed layers in semiconductor processing Thus, it would be desirable to find a method of depositing tantalum/tantalum nitride barrier and copper seed layers at low temperatures such that barrier performance and satisfactory copper fill are not comprised.

Bearing in mind the problems and deficiencies of the prior art, it is therefore an object of the present invention to provide a method of depositing tantalum/tantalum nitride barrier layers at sufficiently low temperatures having reduced grain boundaries so that barrier liner performance is not compromised.

It is another object of the present invention to provide a method of depositing a "no hole" blanket tantalum/tantalum nitride barrier layer within a high aspect ratio opening on a semiconductor wafer such that copper does not diffuse past the barrier layer.

A further object of the invention is to provide a method of depositing a superior copper seed layer at sufficiently low temperatures so that the copper seed layer is uniform and continuous so that the necessary electroplating current may flow throughout the seed layer during electroplating.

It is yet another object of the present invention to provide a method of depositing a "no hole" copper seed layer within a high aspect ratio opening on a semiconductor wafer such that subsequent copper deposition is enhanced.

Still other objects and advantages of the invention will in part be obvious and will in part be apparent from the specification.

SUMMARY OF THE INVENTION

The present invention is directed to, in a first aspect, a method of forming.a barrier film in semiconductor processing in a reaction chamber, the method comprising the steps of: (a) providing a semiconductor wafer having at least one opening formed thereon, the semiconductor wafer placed into the reaction chamber; (b) providing a sputter source selected from the group consisting of tantalum and tantalum nitride having a wafer stage temperature of less than about 0° C.; (c) cooling the semiconductor wafer to a temperature of about 20° C. to about −10° C.; and (d) sputter depositing a layer of material selected from the group consisting of tantalum, tantalum nitride and combinations thereof.

Preferably, step (a) comprises providing a semiconductor wafer having at least one via or trench formed thereon as interconnects, the semiconductor wafer placed into the reaction chamber. Preferably, step (b) comprises providing a sputter source having a wafer stage temperature of about −70° C. to about 0° C. Preferably, step (c) comprises cooling the semiconductor wafer using a backside gas at a pressure of about 2 Torr to about 10 Torr inside the reaction chamber.

Step (d) may comprise sputter depositing a layer of tantalum followed by sputter depositing a layer of tantalum nitride thereover; or sputter depositing a layer of tantalum nitride followed by sputter depositing a layer of tantalum thereover. Preferably, step (d) comprises sputter depositing a layer of material selected from the group consisting of tantalum and tantalum nitride having a minimum thickness of about 40 Å to about 60 Å within the at least one opening. Most preferably, step (d) comprises sputter depositing a layer of material selected from the group consisting of tantalum and tantalum nitride with a hollow cathode magnetron.

The method of the present aspect may further include the steps of sputter depositing a copper seed layer into the at least one opening at a maximum temperature of about 100° C. and filling the at least one opening with copper.

In another aspect, the present invention is directed to a method of filling an opening on a semiconductor wafer comprising the steps of: (a) providing a semiconductor wafer having at least one opening formed thereon, the opening having a barrier film formed therein by (i) cooling the semiconductor wafer to a temperature of about 20° C. to about −10° C.; and (ii) sputter depositing a layer of material selected from the group consisting of tantalum, tantalum nitride, and combinations thereof, using a sputter source having a wafer stage temperature of about −70° C. to about 0° C.; (b) cooling the wafer to a temperature of at least about 0° C.; (c) sputter depositing a seed layer of copper using a sputter source having a wafer stage temperature of about −70° C. to about 0° C.; and (d) filling the at least one opening with copper such that the at least one opening is substantially free of voids.

Preferably, step (a) comprises providing a semiconductor wafer having at least one opening formed thereon, the opening having a barrier film comprising tantalum. The barrier film may also comprise tantalum nitride. Wherein a dual layer barrier film is provided, the first barrier film may comprise tantalum and the second barrier film may comprise tantalum nitride thereover. Alternatively, the first barrier film may comprise tantalum nitride and the second barrier film may comprise tantalum thereover. Preferably, step (c) comprises sputter depositing a seed layer of copper having a minimum thickness of about 50 Å to about 70 Å using a sputter source having a wafer stage temperature of about −50° C.

In yet another aspect, the present invention is directed to a method of semiconductor processing comprising the steps of: (a) providing a semiconductor wafer having at least one opening formed thereon; (b) providing a sputter source having a stage temperature of less than about 0° C., the sputter source selected from the group consisting of tantalum and tantalum nitride; (c) cooling the semiconductor wafer to a temperature of about 20° C. to about −10° C.; (d) sputter depositing a barrier film having a minimum thickness of about 40 Å to about 60 Å within the at least one opening on the semiconductor wafer; (e) providing a copper sputter source having a wafer stage temperature of less than about 0° C.; and (f) sputter depositing a copper seed layer within the at least one opening over the barrier film.

Preferably, in step (a) the semiconductor wafer has at least one via or trench formed thereon as an interconnect. Preferably, step (b) comprises providing a sputter source having a wafer stage temperature of less than about 0° C., the sputter source comprising tantalum, tantalum nitride, or combinations thereof. Preferably, step (c) comprises cooling the semiconductor wafer to a temperature of about 20° C. to about −10° C. using an inert backside gas at a pressure of about 2 Torr to about 10 Torr. Preferably, step (d) comprises sputter depositing a barrier film having a minimum thickness of about 40 Å to about 60 Å within the at least one opening on the semiconductor wafer using a hollow cathode magnetron at about 15 kW to about 20 kW at an argon pressure of about 2 mTorr to about 20 mTorr. Step (d) may comprise sputter depositing a single barrier film comprising tantalum or tantalum nitride; or a dual layer barrier film comprising a first barrier film comprising tantalum followed by a second barrier film comprising tantalum nitride or a first barrier film comprising tantalum nitride followed by a second barrier film comprising tantalum.

Preferably, step (e) comprises providing a copper sputter source having a wafer stage temperature of about −70° C. to about 0° C. Preferably, step (f) comprises sputter depositing a copper seed layer within the at least one opening having a minimum thickness of about 50 Å to about 70 Å. Most preferably, step (f) comprises sputter depositing a copper seed layer within the at least one opening over the barrier film using a hollow cathode magnetron at about 30 kW to about 50 kW at an argon pressure of about 1 mTorr to about 20 mTorr. The method of the present aspect may further include the step of filling the at least one opening with copper.

In still yet another aspect, the present invention is directed to a method of applying thin films for barrier and seed applications in semiconductor processing comprising the steps of: (a) providing a semiconductor wafer having at least one opening thereon; (b) cooling the semiconductor wafer to a temperature of about 20° C. to about −10° C.; (c) sputter depositing a tantalum barrier film within the at least one via using a hollow cathode magnetron with a sputter source having a wafer stage temperature of about −70° C. to about 0° C.; (d) cooling the semiconductor wafer having the barrier film thereon to a temperature of about 20 to about −10° C.; and (e) sputter depositing a copper seed layer having a thickness of about 800 Å to about 2000 Å using a hollow cathode magnetron at about 30 kW to about 50 kW at a pressure of about 1 mTorr to about 20 mTorr.

Preferably, steps (b) and (d) comprises cooling the semiconductor wafer to a temperature of about 20° C. to about −10° C. using a backside gas at a pressure of about 2 Torr to about 10 Torr. Preferably, step (c) comprises sputter depositing a tantalum barrier film having a minimum thickness of about 40 Å to about 60 Å within the at least one via using a hollow cathode magnetron at about 15 kW to about 20 kW at a pressure of about 2 mTorr to about 20 mTorr. Preferably, in step (e) the copper seed layer comprises non-agglomerated copper.

The method of the present aspect may further include the step of sputter depositing a tantalum nitride barrier film over the tantalum barrier film such that a minimum thickness of both the tantalum nitride barrier film and the tantalum barrier film is about 40 Å to about 60 Å.

In a final aspect, the present invention is directed to a method of applying thin films for barrier and seed applications in semiconductor processing comprising the steps of: (a) providing a semiconductor wafer having at least one via thereon; (b) cooling the semiconductor wafer to a temperature of about 20° C. to about −10° C.; (c) sputter depositing a tantalum nitride barrier film within the at least one via using a hollow cathode magnetron; (d) cooling the semiconductor wafer having the barrier film thereon to a maximum temperature of about 100° C.; and (e) sputter depositing a copper seed layer within the at least one via having a minimum thickness of about 50 to about 70 Å using a hollow cathode magnetron at about 30 kW to about 50 kW at a pressure of about 1 mTorr to about 20 mTorr.

Preferably, steps (b) and (d) comprise cooling the semiconductor wafer to a temperature of about 20° C. to about −10° C. using a backside gas at a pressure of about 2 Torr to about 10 Torr. Preferably, step (c) comprises sputter depositing a tantalum nitride barrier film having a minimum thickness of about 40 Å to about 60 Å within the at least one via using a hollow cathode magnetron at about 15 kW to about 20 kW at a pressure of about 2 mTorr to about 20 mTorr. Preferably, in step (e) the copper seed layer comprises non-agglomerated copper. The method of the present aspect may further include the step of sputter depositing a tantalum barrier film over the tantalum nitride barrier film such that a minimum thickness of both the tantalum barrier film and the tantalum nitride barrier film is about 40 Å to about 60 Å.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
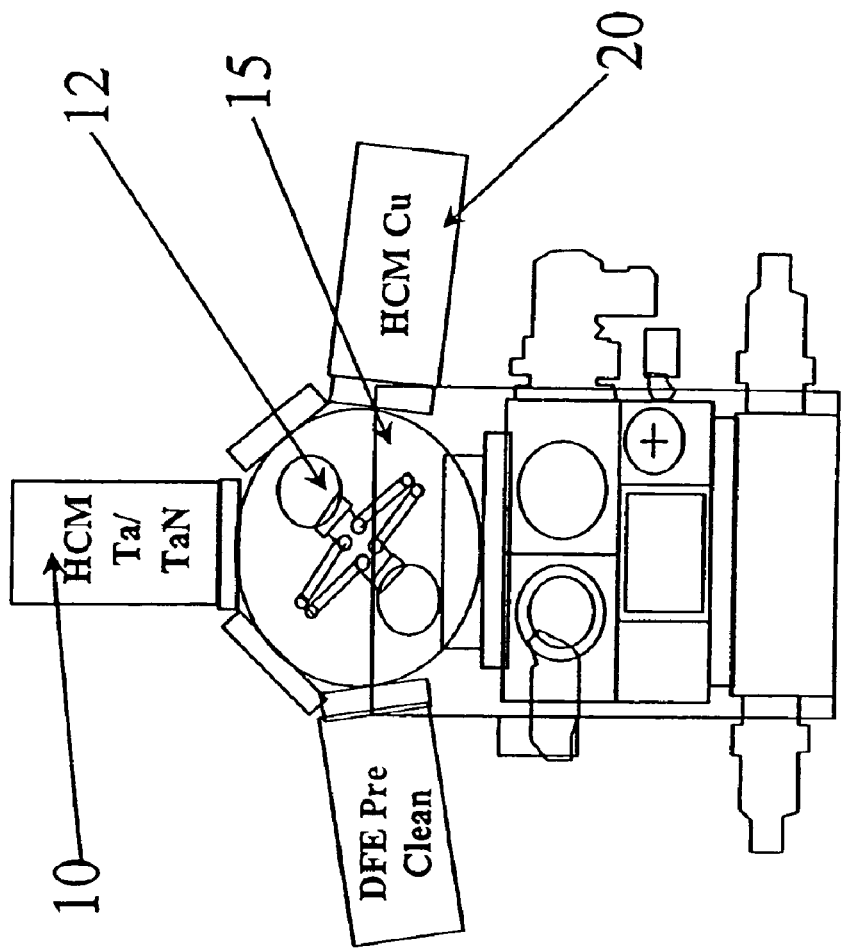
FIG. 1 is a top plan view of a plasma vapor deposition cluster tool with three reaction chambers used to pre-clean a wafer and deposit onto the wafer the tantalum/tantalum nitride/copper thin films of the present invention.

In describing the preferred embodiment of the present invention, reference will be made herein to FIGS. 1–5 of the drawings in which like numerals refer to like features of the invention. Features of the invention are not necessarily shown to scale in the drawings.

The present invention is directed to a method of depositing barrier films comprising tantalum, tantalum nitride and tantalum/tantalum nitride, and copper seed layers in high aspect ratio openings such as vias, contacts or trenches under low temperature conditions. The barrier films and seed layers of the present invention are deposited at extremely low temperatures wherein the wafer stage temperature of the sputter source is about −70° C. to about 0° C., preferably about −50° C., and the wafer is cooled to a temperature of about 20° C. to about −10° C. The resulting tantalum/tantalum nitride barrier films and copper seed layers are superior in surface smoothness, grain size and uniformity such that subsequent filling of the via is substantially void-free.

The method of the present invention is most preferably carried out using a hollow cathode magnetron as disclosed in U.S. Pat. No. 5,482,611 for "Physical Vapor Deposition Employing Ion Extraction From a Plasma" to Helmer et al. A semiconductor wafer is provided having a plurality of devices formed thereon using layers of dielectric material and metallization such as copper. The dielectric layers passivate or protect the metallization layers and is later etched to provide selective access to the metallization layer. Openings such as vias, contacts or trenches are patterned and etched into a layer of dielectric material exposing a top portion of the metallization such that an interconnect may be made with the existing metallization and a subsequently formed metallization. The process of forming contacts, vias and/or trenches are known in the art.

Once the openings have been formed, the semiconductor wafer is preferably placed into a PVD cluster tool (see FIG. 1) such as an Inova™ manufactured by Novellus Systems, Inc. of San Jose, Calif., which has multiple chambers. The semiconductor wafer 12 is placed into transfer chamber 15. Transfer chamber 15 is placed under vacuum to a base pressure of less than about $1 \times 10^{-6}$ Torr. A robotic arm within the chamber transfers wafer 12 into a pre-clean chamber and cleans the wafer using an inductively-coupled plasma (ICP) to remove native oxide that is formed on the wafer surface. Thereafter, wafer 12 is transferred to tantalum or tantalum nitride reaction chamber 10 for deposition of the barrier layer film. Reaction chamber 10 is preferably kept at a base pressure of less than about $1 \times 10^{-7}$ Torr.

The barrier liner is preferably sputter deposited using a hollow cathode magnetron (HCM) although other methods may be utilized as well. Preferably, the wafer stage temperature of the tantalum or tantalum nitride reaction chamber 10 is set to about −70° C. to about 0° C., preferably about −50° C. Once the wafer is placed on the wafer stage, a backside gas is turned on to enable heat transfer from the wafer to the cold stage so that the wafer may be cooled to a temperature of about 20° C. to about −10° C. The backside gas is preferably an inert gas such as argon or helium at a pressure of about 2 Torr to about 3 Torr. In some applications, the pressure of the backside gas may be as high as about 10 Torr. The backside gas stays on during the entire deposition process.

Tantalum or tantalum nitride is sputter deposited such that a barrier film having a minimum thickness of about 40 Å to about 60 Å is deposited conformally inside the opening The preferred thickness of the barrier film will assure proper barrier performance in inhibiting copper diffusion. If a multi-layer barrier film is required, the second film is deposited at this point. For example, a tantalum film may be followed by deposition of a tantalum nitride film and vice versa. However, it is important that the total barrier liner thickness inside the opening be kept to a minimum of about 40 Å to about 60 Å.

In a preferred embodiment wherein an HCM source is used to deposit the barrier layer, the tantalum or tantalum nitride source power is set at about 15 kW to about 20 kW at a pressure inside the chamber of about 2 mTorr to about 20 mTorr using argon as the backside gas. At about 15 kW, a 300 Å thick film in the flat field of the wafer is formed in about 20 seconds. Thus, in a 0.25 µm high aspect ratio via of about 5:1, a barrier liner thickness inside the via within the requisite minimum thickness of about 40 Å to about 60 Å is almost guaranteed given the superior step coverage performance of the HCM source. The plasma is formed when argon gas is injected into the chamber to pressurize the chamber to the desired pressure. A DC supply is turned on at the set point of about 15 kW to about 20 kW. The plasma is ignited and maintained by the secondary electron emission from the target.

Figure 2:
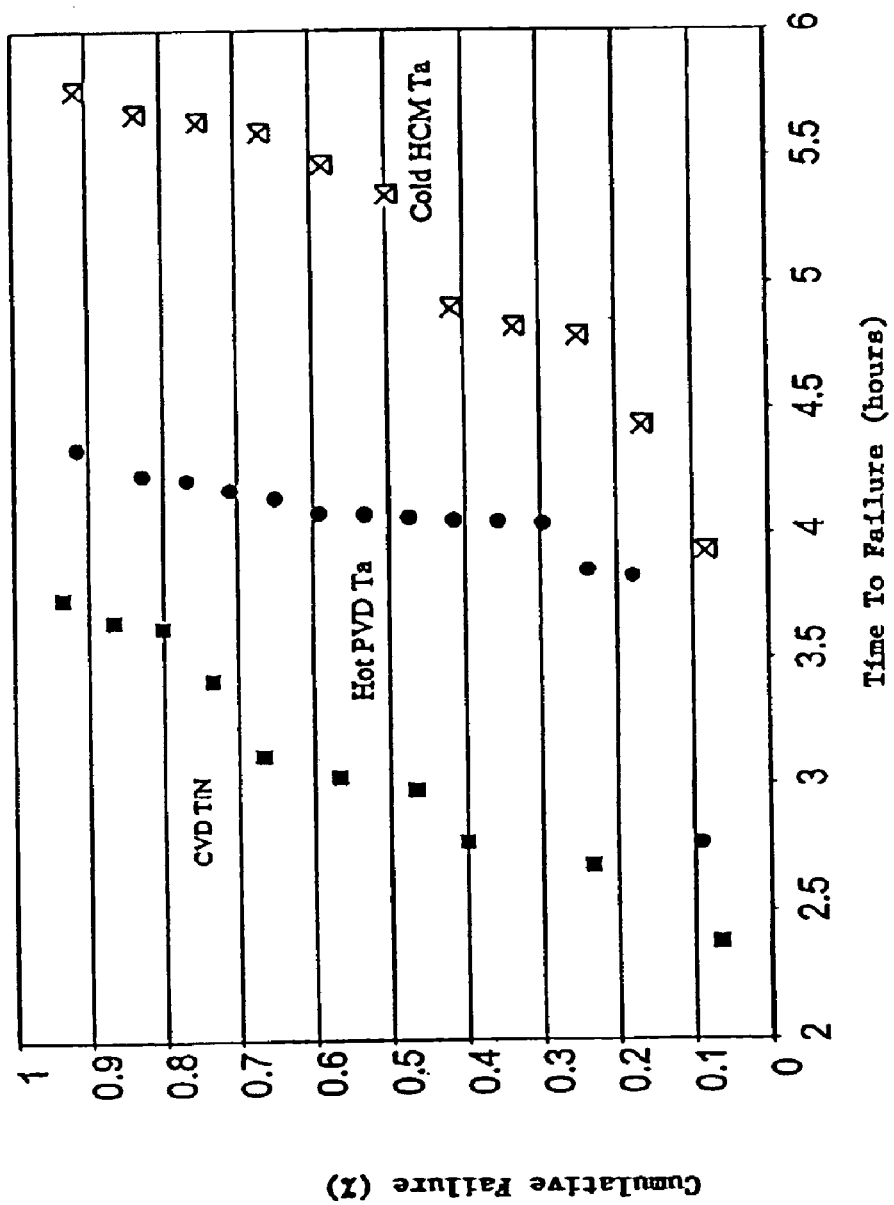
FIG. 2 is a diagram showing the time to failure of a tantalum barrier film deposited in accordance with the present invention compared with prior art barrier film.

FIG. 2 shows the barrier performance of a tantalum layer having a thickness of about 100 Å deposited at low temperature in accordance with the present invention compared with other barrier layers, for example, a titanium nitride film about 100 Å thick deposited using chemical vapor deposition at about 350° C. at about 60 Torr; and a tantalum film about 100 Å thick deposited using plasma vapor deposition at wafer temperature about −150° C. Under a bias-temperature stress test of about 2 MV/cm at about 250° C., the time-to-failure for the titanium nitride barrier is about 2.4 to about 2.7 hours and for the high temperature deposited tantalum barrier is about 3.8 to about 4.4 hours. Unexpectedly, the time-to-failure for the cold tantalum barrier deposited in accordance with the present invention is about 3.9 to about 5.8 hours, a significant greater level of barrier performance.

Wafer 12 is then moved to the copper module of the reaction chamber for deposition of the copper seed layer. At this point, the wafer temperature is about 0° C. or may be near room temperature. The difference between the wafer temperature and the stage temperature of the previous reaction chamber 10 is due to the heat load from the HCM plasma source. Thus, wafer 12 must be cooled prior to satisfactory deposition of the copper seed layer.

Within the copper deposition module 20, the copper module wafer stage is set to about −70° C. to about 0° C., preferably about −50° C. as well. Wafer 12 is transferred onto the wafer stage and the backside gas is turned on to cool the wafer. A backside gas pressure of about 2 Torr to about 10 Torr is created to enable efficient cooling of the wafer to at least about 0° C. Again, the backside gas remains on during the deposition of the copper seed layer to ensure that the wafer temperature never exceeds 100° C. The copper HCM plasma source is set to about 30 kW to about 36 kW at an argon pressure of about 1 mTorr to about 20 mTorr. At this power level, the copper seed thickness is about 800 Å to about 2000 Å, preferably about 1500 Å, such that the minimum thickness of the seed layer is about 50 Å to about 70 Å inside a 0.25 µm, 5:1 aspect ratio via. This thickness ensures satisfactory filling of the opening in subsequent electroplating or CVD copper deposition.

Figure 3:
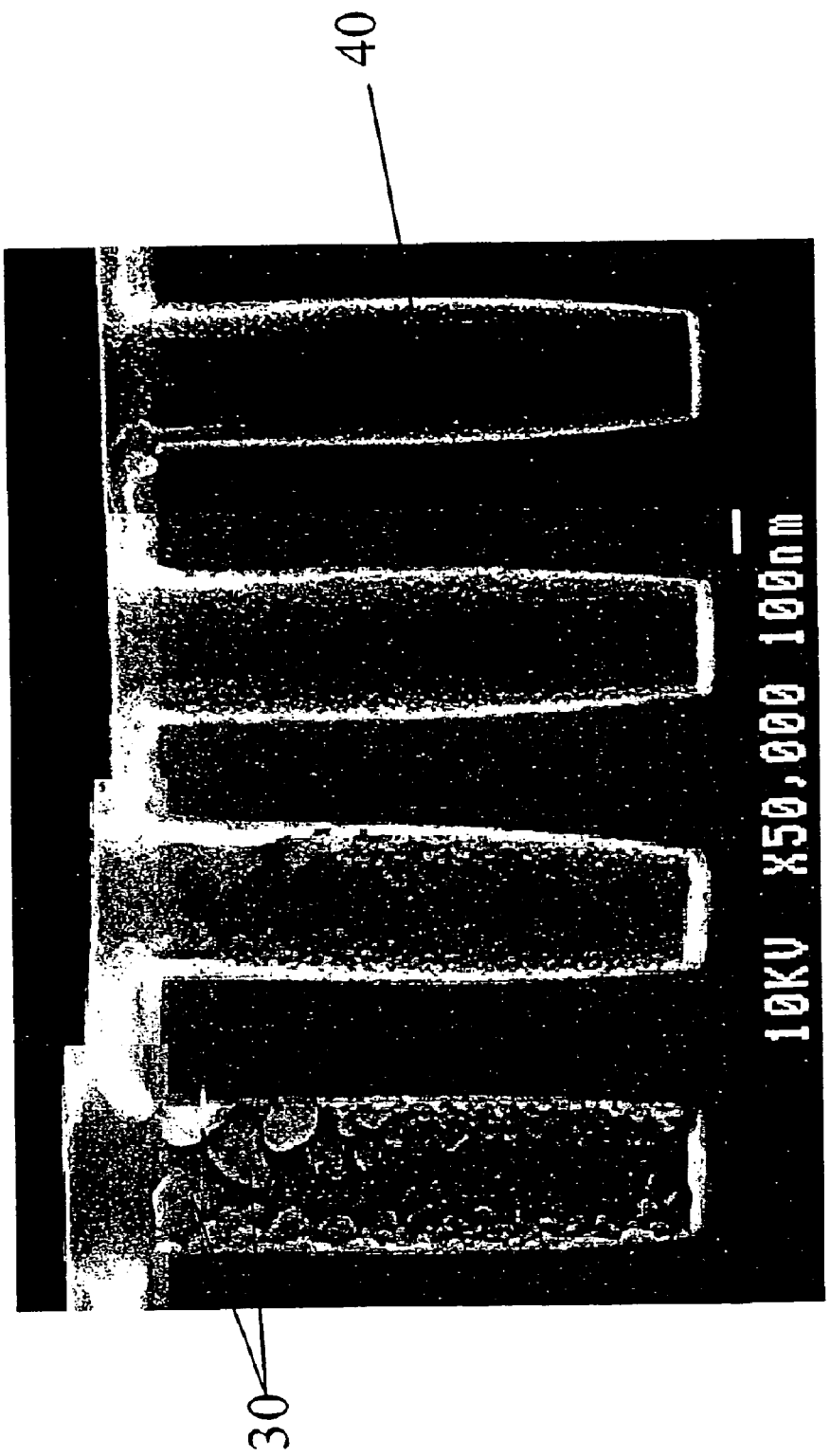
FIG. 3 is a cross-sectional photomicrograph of high aspect ratio vias A–D having copper seed layers deposited at different temperatures.

The same necessity for uniformity applies to the copper seed layer as well. A smooth copper seed layer promotes a more uniform and continuous growth of subsequent electroplating or CVD copper deposition. FIG. 3 compares the differences in copper grain size and/or agglomeration of the formation of the seed layer deposited at increasing temperatures within vias A–D and how the subsequent electroplating is affected by the grain size and/or agglomeration of the seed layer. The deposition temperatures as shown are >200° C. for via A and <50° C. for via D with vias B and C deposited at intermediate temperatures wherein the temperature for B is greater than the temperature for C. In via A, the copper grains 30 have coalesced to form undesirably large size agglomerates due to excessive heat to the wafer. The high temperature deposition of via A forces the copper to increase its surface diffusion resulting in a non-uniform, rough seed layer. In contrast, via D shows uniform grain growth 40 with minimum agglomeration resulting in a substantially smooth surface within the via.

Figure 4:
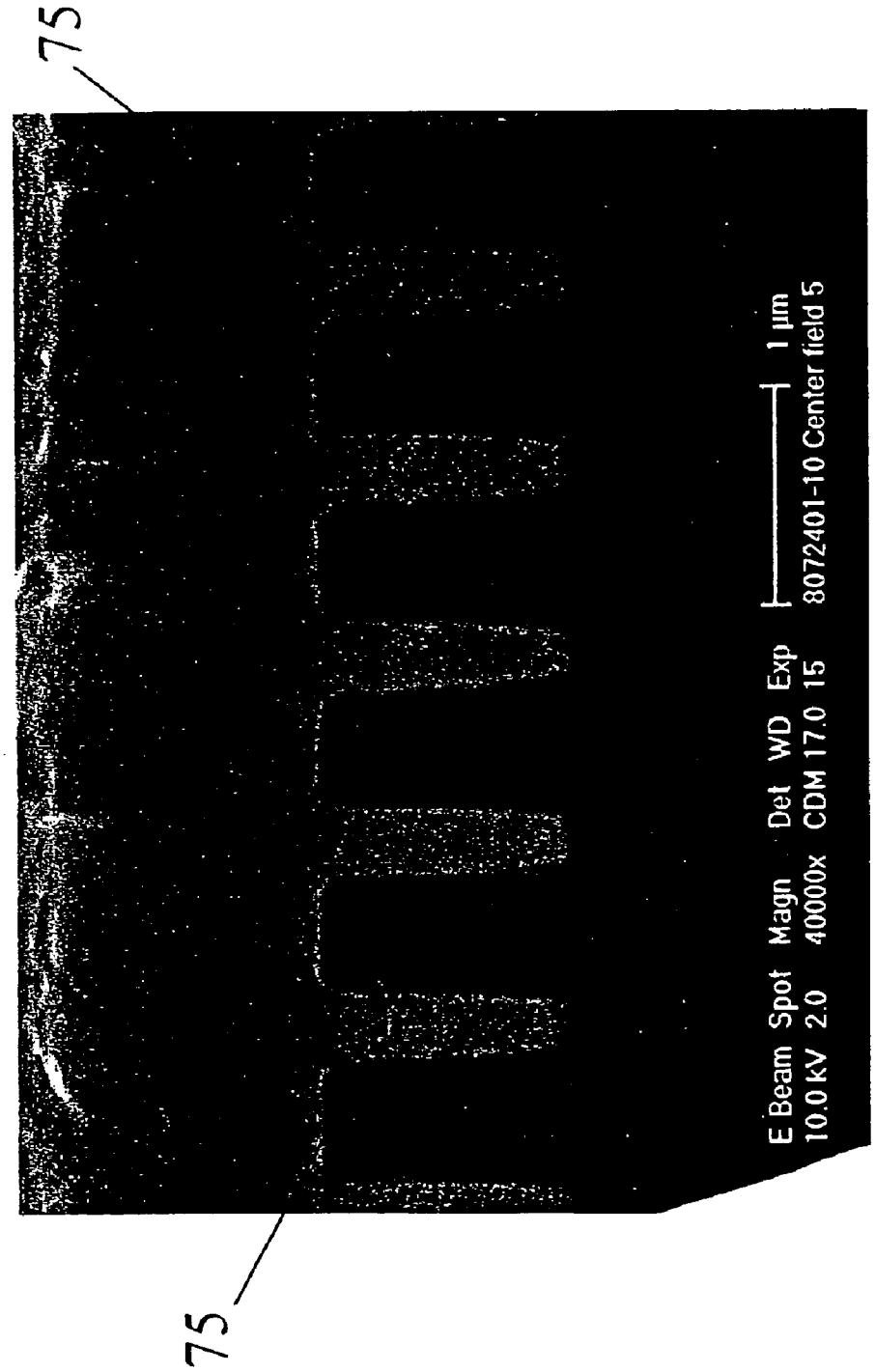
FIG. 4 is a cross-sectional photomicrograph of high aspect ratio vias after filling the via with copper wherein the copper seed layers were formed prior to deposition utilizing a preferred method of the present invention.
Figure 5:
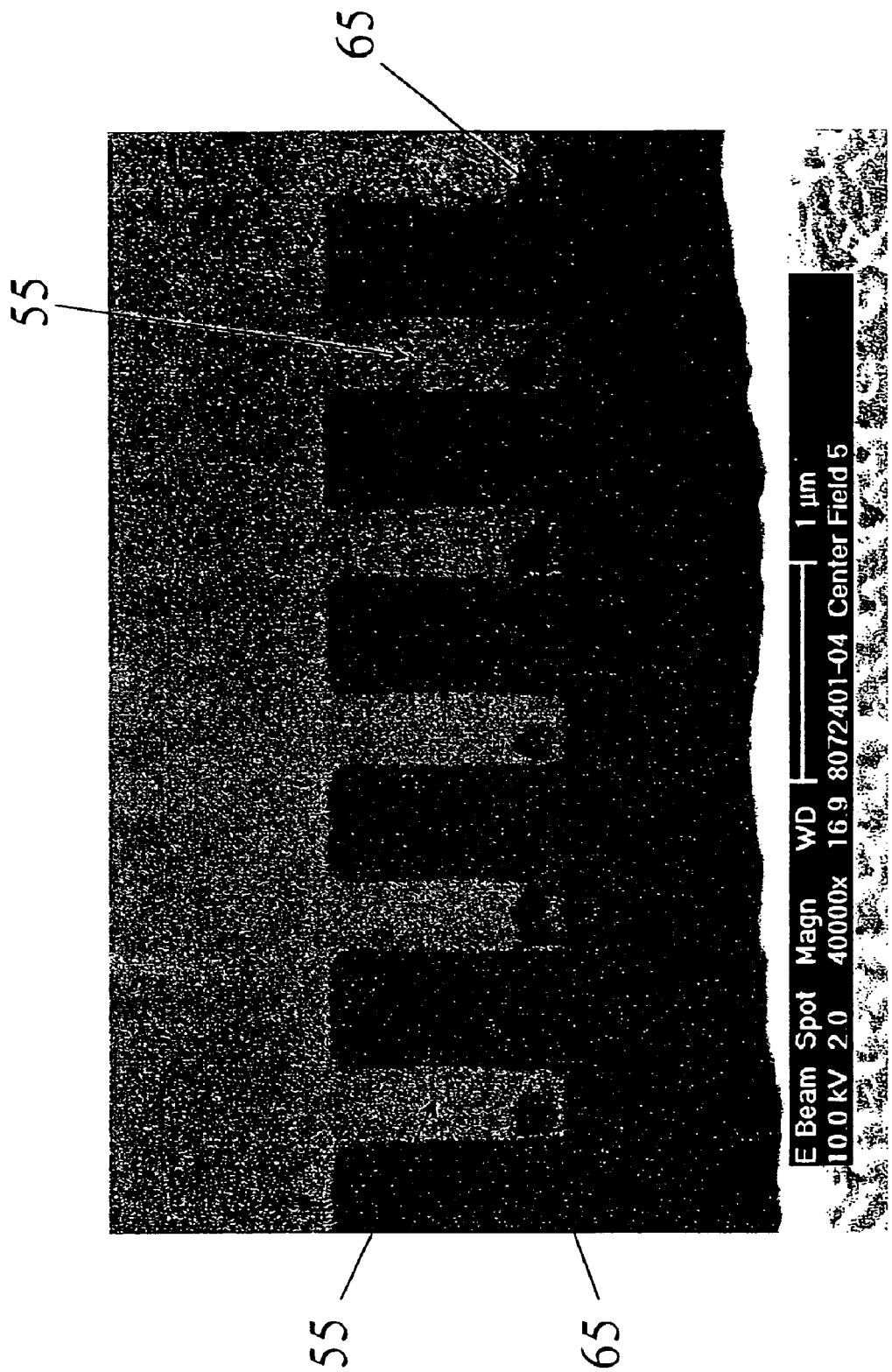
FIG. 5 is a cross-sectional photomicrograph of high aspect ratio vias after filling the via with copper wherein conventional copper seed layers were formed utilizing prior art methods.

Once the copper seed layer is in place, the wafer is sent to a cooling station to cool the wafer to ambient temperature prior to copper deposition and filling the opening The barrier and seed layers deposited in accordance with the present invention provide enhanced copper filling of the features. FIG. 4 shows electroplating on a copper seed layer that was deposited in accordance with the present invention. Vias 75 are completely filled with the copper and are substantially void-free. Compare this with FIG. 5 showing the electroplating fill of vias 55 having a conventional copper seed layer deposited at high temperatures. Voids 65 in the copper fill are quite noticeable and would result in faulty devices.

In a preferred embodiment of the above process, an HCM source as described in U.S. Pat. No. 5,482,611 to Helmer can be used in combination with a cold electrostatic chuck (ESC) to produce cold tantalum/tantalum nitride barrier liners and copper seed layers. The ESC can be cooled using chilled gas or liquid, e.g. chilled $N_2$ gas, to a temperature of less than about −50° C. The ESC temperature is actively controlled to a set point. RF bias, if needed, can be applied at low to moderate levels, about 0 to about 500 W, to the chuck such that the wafer is not overheated. The time to failure results discussed above were obtained without the application of any RF bias.

The HCM IPVD produces plasmas in the order of 1–5× $10^{12}$ #/cm$^3$. Due to the higher plasma density, films can be deposited using the HCM IPVD with adequate step coverage without the application of an RF bias to the wafer pedestal. In addition, the wafer temperature can be controlled in a tighter fashion for cold deposition of tantalum/tantalum nitride barrier films and copper seed layers. For such applications the HCM source can be used along with a cold pedestal to achieve smooth, small grain size films that have superior properties.

The present invention achieves recited above. By depositing single or dual layer barrier films comprising tantalum and/or tantalum nitride into high aspect ratio openings at sub-zero temperatures, the resulting barrier films have reduced grain boundaries which provide enhanced barrier liner performance over the prior art. The method of the present invention provides a continuous, "no hole" blanket to tantalum and/or tantalum nitride such that the copper interconnect will not diffuse past the barrier into the electronic devices of the semiconductor wafer. The present invention also provides a method of depositing copper seed layers at extremely low temperatures to form a continuous, "no hole" seed layer so that subsequent copper deposition is substantially void-free. Thus, high aspect ratio openings having barrier and seed layers deposited in accordance with the present invention provide superior interconnects for enhanced performance of the resultant semiconductor wafer.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of applying thin films for barrier and seed applications in semiconductor processing comprising the steps of:

providing a semiconductor wafer having at least one via thereon;

cooling said semiconductor wafer to a temperature of about 20° C. to about −10° C.;

sputter depositing a tantalum nitride barrier film within the at least one via using a hollow cathode magnetron;

cooling said semiconductor wafer having said barrier film thereon to a maximum temperature of about 100° C.; and sputter depositing a copper seed layer within the at least one via having a minimum thickness of about 50 to about 70 Å using a hollow cathode magnetron at about 30 kW to about 50 kW at a pressure of about 1 mtorr to about 20 mTorr.

2. The method of claim 1 wherein steps (b) and (d) comprise cooling said semiconductor wafer to a temperature of about 20° C. to about −10° C. using a backside gas at a pressure of about 2 Torr to about 10 Torr.

3. The method of claim 1 wherein step (c) comprises sputter depositing a tantalum nitride barrier film having a minimum thickness of about 40 Å to about 60 Å within the at least one via using a hollow cathode magnetron at about 15 kW to about 20 kW at a pressure of about 2 mTorr to about 20 mTorr.

4. The method of claim 1 wherein in step (e) said copper seed layer comprises non-agglomerated copper.

5. The method of claim 1 further including the step of sputter depositing a tantalum barrier film over said tantalum nitride barrier film such that a thickness of both said tantalum barrier film and said tantalum nitride barrier film is about 40 Å to about 60 Å.

* * * * *

UNITED STATES PATENT AND TRADEMARK OFFICE
CERTIFICATE OF CORRECTION

PATENT NO. : 6,905,959 B1
DATED : June 14, 2005
INVENTOR(S) : Ashtiani et al.

It is certified that error appears in the above-identified patent and that said Letters Patent is hereby corrected as shown below:

Column 1,
Line 57, delete "moor" and substitute therefor -- more --.

Column 2,
Line 27, delete "t" before "tantalum/tantalum nitride".
Line 36, delete "comprised" and substitute therefor -- compromised --.

Column 5,
Line 48, delete "time to failure" and substitute therefor -- time-to-failure --.

Column 7,
Line 29, delete "-150°C" and substitute therefor -- 150°C --.

Column 8,
Line 49, after "achieves" insert -- the objects --.
Line 56, delete "to" and substitute therefor -- of --.

Signed and Sealed this

Thirteenth Day of September, 2005

JON W. DUDAS
*Director of the United States Patent and Trademark Office*